United States Patent
Park et al.

(10) Patent No.: US 7,972,923 B2
(45) Date of Patent: Jul. 5, 2011

(54) NON-VOLATILE MEMORY DEVICE AND METHOD OF MANUFACTURING THE SAME

(75) Inventors: Jung-Hyun Park, Seoul (KR); Jung-Geun Jee, Seoul (KR); Hyoeng-Ki Kim, Suwon-si (KR); Yong-Woo Hyung, Yongin-si (KR); Won-Jun Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1253 days.

(21) Appl. No.: 11/605,317

(22) Filed: Nov. 29, 2006

(65) Prior Publication Data

US 2008/0105915 A1    May 8, 2008

(30) Foreign Application Priority Data

Oct. 18, 2006   (KR) .................. 10-2006-0101158

(51) Int. Cl.
*H01L 21/336* (2006.01)
(52) U.S. Cl. .................. 438/257; 257/316; 257/E21.69
(58) Field of Classification Search .................. 438/257; 257/316, E21.69
See application file for complete search history.

(56) References Cited

U.S. PATENT DOCUMENTS

| 6,677,639 | B2 | 1/2004 | Lee et al. | |
| 6,927,447 | B2 | 8/2005 | Choi et al. | |
| 7,151,295 | B2 * | 12/2006 | Yaegashi et al. | 257/316 |
| 7,273,796 | B2 * | 9/2007 | Smythe et al. | 438/438 |
| 2002/0137306 | A1 * | 9/2002 | Chen | 438/430 |
| 2003/0022522 | A1 * | 1/2003 | Nishiyama et al. | 438/762 |
| 2005/0142745 | A1 | 6/2005 | Jung et al. | |
| 2010/0019315 | A1 * | 1/2010 | Im | 257/330 |

FOREIGN PATENT DOCUMENTS

| KR | 10-2003-0008990 | 1/2003 |
| KR | 10-2004-0011656 | 2/2004 |
| KR | 10-2005-0066883 | 6/2005 |
| KR | 2006-0084106 | 7/2006 |

* cited by examiner

*Primary Examiner* — Fernando L Toledo
(74) *Attorney, Agent, or Firm* — Lee & Morse, P.C.

(57) ABSTRACT

A semiconductor device may include a tunnel insulating layer disposed on an active region of a substrate, field insulating patterns disposed in surface portions of the substrate to define the active region, each of the field insulating patterns having an upper recess formed at an upper surface portion thereof, a stacked structure disposed on the tunnel insulating layer, and impurity diffusion regions disposed at surface portions of the active region adjacent to the stacked structure.

16 Claims, 7 Drawing Sheets

NON-VOLATILE MEMORY DEVICE AND METHOD OF MANUFACTURING THE SAME

BACKGROUND OF THE INVENTION

1. Field of the Invention

The present invention relates to semiconductor devices, and a method of manufacturing semiconductor devices. More particularly, the present invention relates to semiconductor devices such as a non-volatile memory device including a floating gate electrode, and a method of manufacturing the semiconductor device.

2. Description of the Related Art

Semiconductor memory devices are generally classified as either volatile or non-volatile semiconductor memory devices. Volatile semiconductor memory devices, such as dynamic random access memory (DRAM) devices and/or static random access memory (SRAM) devices, have a relatively high response speed. However, the volatile semiconductor memory devices lose data stored therein when power is shut off. On the other hand, although non-volatile semiconductor memory devices, such as electrically erasable programmable read only memory (EEPROM) devices and/or flash memory devices, have a relatively slow response speed, non-volatile semiconductor memory devices are capable of maintaining data stored therein even when power is shut off.

In EEPROM devices, data may be electrically stored (i.e., programmed) or erased through a Fowler-Nordheim (F-N) tunneling mechanism and/or a channel hot electron injection mechanism. Flash memory devices are generally classified as a floating gate type or a charge trap type such as silicon oxide nitride oxide semiconductor (SONOS) type devices and/or metal oxide nitride oxide semiconductor (MONOS) type devices.

A floating gate type non-volatile memory device comprises a gate structure and source/drain regions. The gate structure comprises a tunnel insulating layer pattern, a floating gate electrode, a blocking layer and a control gate electrode. A silicon oxide layer formed by a thermal oxidation process may be used as the tunnel insulating layer pattern. A dielectric layer having a multilayered structure, which includes a lower silicon oxide layer, a silicon nitride layer and an upper silicon oxide layer, may be used as the blocking layer. The floating gate electrode and the control gate electrode may include polysilicon doped with impurities.

The tunnel insulating layer is formed on an active region of a semiconductor substrate. The active region is defined by field insulating patterns formed in surface portions of the semiconductor substrate. The blocking layer is formed on the floating gate electrode and the field insulating patterns. The control gate electrode extends in a direction substantially perpendicular to an extension direction of the active region on the blocking layer.

To improve a coupling ratio of the non-volatile memory device, i.e., a ratio of a capacitance ($C_{tun}$) of the tunnel insulating layer to a sum the capacitance ($C_{tun}$) and a capacitance ($C_{ono}$) of the blocking layer, a height of upper surfaces of the field insulating patterns may be reduced. However, with such an approach for improving the coupling ratio, although the coupling ratio may be improved, electrical disturbance may occur between the active region and the control gate electrode, thereby deteriorating device reliability.

SUMMARY OF THE INVENTION

The present invention is therefore directed to semiconductor memory devices and methods of forming semiconductor memory devices, which substantially overcome one or more of the problems due to the limitations and disadvantages of the related art.

It is therefore a feature of embodiments of the invention to provide a semiconductor device having improved reliability, and a method of manufacturing a semiconductor device having improved reliability.

It is therefore a separate feature of embodiments of the invention to remove an oxide layer on a floating gate pattern by an anisotropic etching process and an isotropic etching process.

It is therefore a separate feature of embodiments of the invention to provide a semiconductor device and a method of forming a semiconductor device that maintains a sufficient distance between an active region and a control gate electrode may be sufficiently secured.

It is therefore a separate feature of embodiments of the invention to provide a semiconductor device and a method of forming a semiconductor device capable of operating with a lower amount electrical disturbance compared to conventional devices having similar coupling ratios.

At least one of the above and other features and advantages of the invention may be realized by providing a semiconductor device, including tunnel insulating layer disposed on an active region of a substrate, field insulating patterns disposed in surface portions of the substrate to define the active region, each of the field insulating patterns having an upper recess formed at an upper surface portion thereof, a stacked structure disposed on the tunnel insulating layer, and impurity diffusion regions disposed at surface portions of the active region adjacent to the stacked structure.

The upper recess may have a curved bottom surface. The stacked structure may include a floating gate electrode, a blocking layer and a control gate electrode. The blocking layer may extend continuously along upper surfaces of the field insulating patterns. The upper recess may be filled with a conductive material of the control gate electrode.

At least one of the above and other features and advantages of the invention may be separately realized by providing a method of manufacturing a semiconductor device, including forming a tunnel insulating layer on an active region of a substrate, forming field insulating patterns in surface portions of the substrate to define the active region, each of the field insulating patterns having an upper recess formed at an upper surface portion thereof, forming a stacked structure on the tunnel insulating layer, and forming impurity diffusion regions at surface portions of the active region adjacent to the stacked structure.

The upper recess may have a curved bottom surface. The method may include forming preliminary field insulating patterns to define an opening exposing the active region, wherein each of the preliminary field insulating patterns may include a lower pattern directly between respective facing ones of the surface portions of the substrate and an upper pattern protruding beyond an upper surface of the active region of the substrate. Forming the preliminary field insulating patterns may include forming mask patterns on the substrate, patterning the surface portions of the substrate using the mask patterns to form trenches at the surface portions of the substrate, forming a field insulating layer on the mask patterns and the substrate to fill up the trenches, planarizing the field insulating layer to form the preliminary field insulating patterns and to expose the mask patterns, and removing the mask patterns to form the opening.

The method may include forming a floating gate conductive layer on the tunnel insulating layer and the preliminary field insulating patterns to fill up the opening, and planarizing the floating gate conductive layer to form a floating gate pattern in the opening and to expose the preliminary field insulating patterns. Forming the field insulating patterns may include removing the upper patterns of the preliminary field insulating patterns to expose side surfaces of the floating gate pattern, performing a re-oxidation process to remove defect sites of the floating gate pattern, performing an anisotropic etching process to remove an oxide layer formed on the floating gate pattern by the re-oxidation process, and performing an isotropic etching process to remove remaining portions of the oxide layer after the anisotropic etching process.

The stacked structure may include a floating gate electrode, a blocking layer pattern and a control gate, and forming the stacked structure may include forming a blocking layer on the floating gate pattern and the field insulating patterns, forming a control gate conductive layer on the blocking layer, and patterning the control gate conductive layer, the blocking layer, the floating gate pattern and the tunnel insulating layer, thereby respectively defining the control gate, the blocking layer pattern, the floating gate electrode, and a tunnel insulating pattern. The blocking layer may extend continuously along surfaces of the floating gate pattern and the field insulating patterns. The blocking layer may include a lower dielectric layer, a middle dielectric layer and an upper dielectric layer. The lower and upper dielectric layers may include silicon oxide, and the middle dielectric layer may include silicon nitride or a metal oxide having a dielectric constant higher than that of silicon nitride. The metal oxide may include hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and/or lutetium (Lu).

Forming the control gate conductive layer may include filling up the upper recesses of the field insulating patterns. The method may include performing a first heat treatment process under an atmosphere containing nitrogen to remove defect sites of the tunnel insulating layer, and performing a second heat treatment process under an atmosphere containing chlorine to remove remaining defect sites after performing the first heat treatment process. The first heat treatment process may be performed using a reaction gas including nitrogen (N2) and nitric oxide (NO). The second heat treatment process may be performed using a reaction gas including oxygen (O2) and hydrogen chloride (HCl). The first and second heat treatment processes may be performed at a temperature of about 800° C. to about 1050° C.

At least one of the above and other features and advantages of the present invention may be separately realized by providing a method of manufacturing a semiconductor device including forming a tunnel insulating layer on an active region of a substrate, forming field insulating patterns in surface portions of the substrate to define the active region, forming a floating gate pattern on the tunnel insulating layer, forming an oxide layer on the floating gate pattern, performing an anisotropic etching process to remove a portion of the oxide layer, and performing an isotropic etching process to remove a remaining portion of the oxide layer, wherein each of the field insulating patterns includes an upper recess formed at an upper surface portion thereof.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
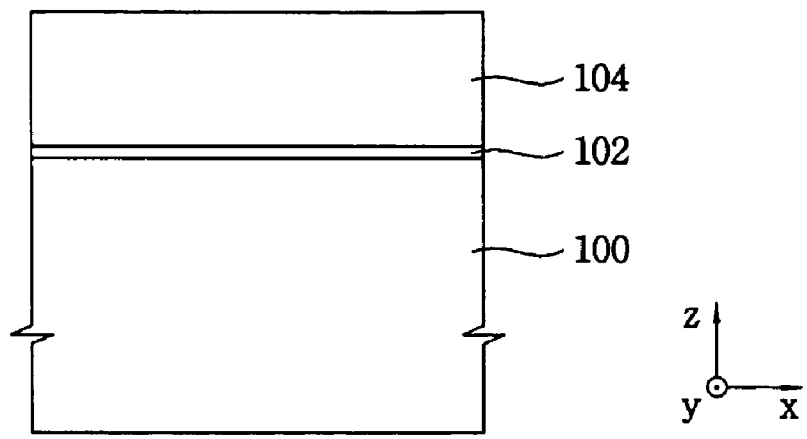
FIGS. 1 to 14 illustrate cross-sectional views of resultant structures obtainable while performing a method of manufacturing a semiconductor device according to one or more aspects of the present invention.

Korean Patent Application No. 2006-101158 filed on Oct. 18, 2006, in the Korean Intellectual Property Office, and entitled: "Non-Volatile Memory Device and Method of Manufacturing the Same," is incorporated by reference herein in its entirety.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both orientations of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, embodiments of the present invention will be explained in detail with reference to the accompanying drawings.

FIGS. 1 to 14 illustrate cross-sectional views of resultant structures obtainable while performing a method of manufacturing a semiconductor device according to one or more aspects of the present invention. More particularly, FIGS. 2 to 13 illustrate cross-sectional views taken along a first direction along which a word line of a semiconductor device extends, e.g., x-direction. FIG. 14 illustrates a cross-sectional view taken along a second direction along which an active region of the semiconductor device extends, e.g., y-direction.

Referring to FIG. 1, a pad oxide layer 102 may be formed on a semiconductor substrate 100 such as a silicon wafer, and a mask layer 104 may then be formed on the pad oxide layer 102.

The pad oxide layer 102 may be formed to a thickness of, e.g., about 70 Å to about 100 Å by, e.g., a thermal oxidation process or a chemical vapor deposition (CVD) process. More particularly, e.g., the pad oxide layer 102 may be formed at a temperature of, e.g., about 750° C. to about 900° C. for a surface treatment of the semiconductor substrate 100.

The mask layer may include, e.g., silicon nitride, and may be formed to a thickness of, e.g., about 1500 Å by, e.g., a low pressure chemical vapor deposition (LPCVD) process or a plasma-enhanced chemical vapor deposition (PECVD) process using, e.g., dichlorosilane ($SiH_2Cl_2$), silane ($SiH_4$), ammonia ($NH_3$), etc.

Figure 2:
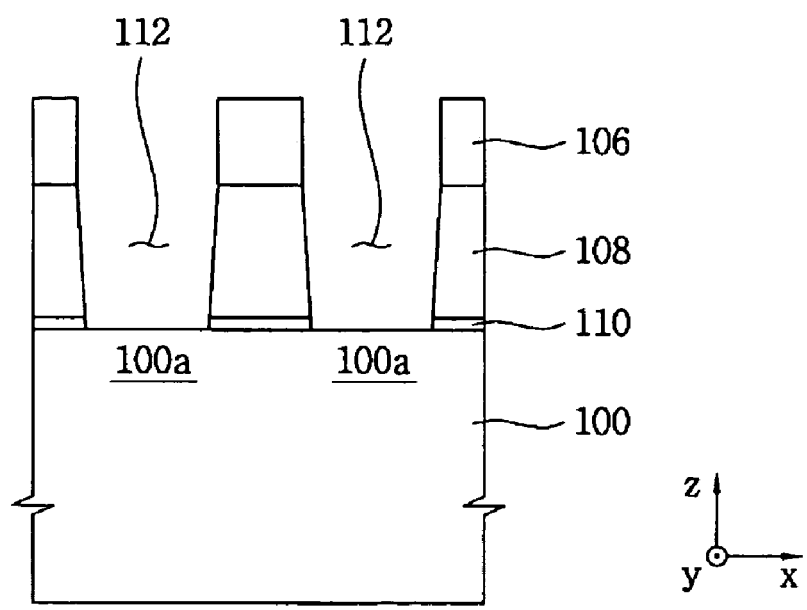

Referring to FIG. 2, photoresist patterns 106 partially exposing surface portions of the mask layer 104 may be formed on the mask layer 104 by a photolithographic process. Portions of the mask layer 104 and the pad oxide layer 102 may be sequentially etched away by an etching process using the photoresist patterns 106 as etching masks, thereby forming mask patterns 108 and pad oxide patterns 110 on the semiconductor substrate 100. The mask patterns 108 and the pad oxide patterns 110 may define first openings 112 respectively exposing isolation regions 100a of the semiconductor substrate 100.

In embodiments of the invention, portions of the mask layer 104 and the pad oxide layer 102 may be etched away by, e.g., a dry etching process using plasma or a reactive ion etching process. The photoresist patterns 106 may be removed by ashing and stripping processes after forming the mask patterns 108 and the pad oxide patterns 110.

Each of the mask patterns 108 may have inclined side surfaces. For example, as shown in FIG. 2, a distance between upper portions of adjacent ones of the mask patterns 108 may be wider than that between lower portions of adjacent ones of the mask patterns 108.

Figure 3:
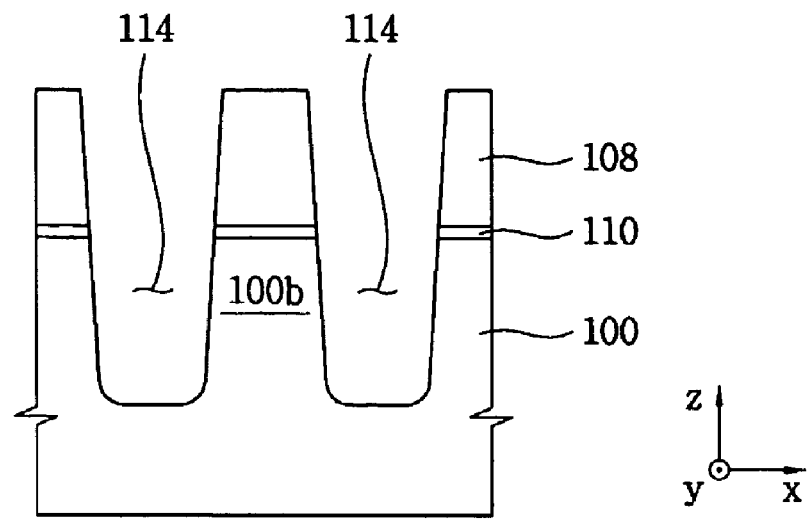

Referring to FIG. 3, an etching process using the mask patterns 108 as etching masks may be performed to etch away the isolation regions 100a of the semiconductor substrate 100, thereby forming trenches 114 in the semiconductor substrate 100. The trenches 114 may extend along a third direction, e.g., z-direction, and may be formed to a depth of, e.g., about 1000 Å to about 5000 Å from a surface of the semiconductor substrate 100.

Alternatively, a thermal oxidation process on sidewalls of the trenches 114 may be additionally performed to cure silicon damage caused by impinging high energy ions during the etching process for forming the trenches 114 and prevent and/or reduce generation of leakage current through the sidewalls of the trenches 114. For example, in embodiments of the invention, during the thermal oxidation process, trench oxide layers (not shown) may be formed to a thickness of e.g., about 50 Å to about 250 Å on surfaces of the sidewalls of the trenches 114, e.g., corresponding surfaces of the semiconductor substrate 100.

Further, liner nitride layers (not shown) may be formed to a thickness of about 50 Å to about 100 Å on the trench oxide layers. Such liner nitride layers may substantially reduce and/or prevent diffusion of impurities (e.g., carbon and hydrogen), from a subsequently formed trench-filling layer, e.g., a field insulating layer, into active regions 100b of the semiconductor substrate 100 defined by the trenches 114.

In other embodiments of the present invention, the trenches 114 may be formed by an etching process using the photoresist patterns 106 as etching masks.

Figure 4:
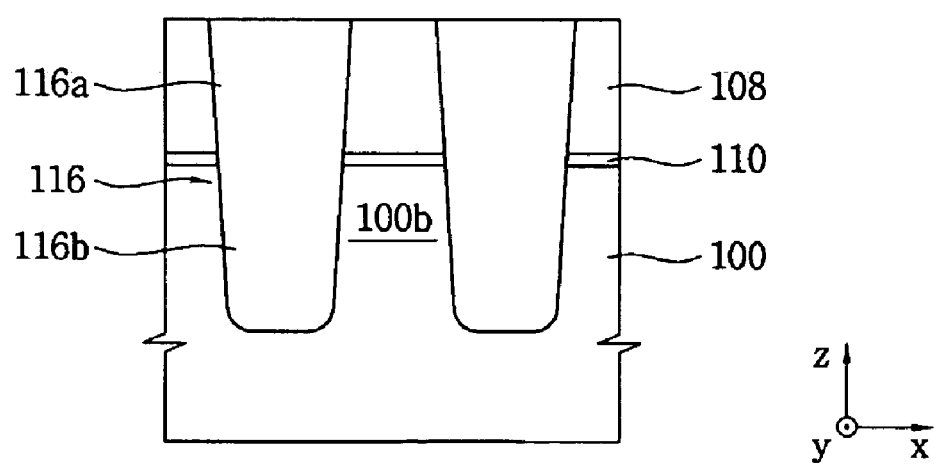

Referring to FIG. 4, a field insulating layer (not shown) may be formed on the semiconductor substrate 100 in which the trenches 114 are formed. The field insulating layer may at least fill up the trenches 114 and may completely fill respective spaces between opposing surfaces of adjacent pad oxide patterns 110a and adjacent mask patterns 108. The field insulating layer may include, e.g., silicon oxide such as undoped silicate glass (USG), tetra-ethyl-ortho-silicate (TEOS), high-density plasma (HDP) CVD oxide, and the like. These materials may be used alone or in a combination thereof. For example, the field insulating layer may be formed by an HDP CVD process using silane ($SiH_4$), oxygen ($O_2$) and argon (Ar) as plasma source gases.

A planarization process, e.g., a chemical mechanical polishing (CMP) process, may be performed to remove a portion of the field insulating layer, e.g., portion of the field insulating layer around an outer and/or exposed boundary thereof, and to expose the mask patterns 108, thereby forming preliminary field insulating patterns 116 in the trenches 114. At least portions of the preliminary field insulating patterns 116 may serve as isolation layer patterns, and may define the active regions 100b of the semiconductor substrate 100. Though not evident from the accompanying figures, portions of the mask patterns 108 may be removed while performing the planarization process.

Each of the preliminary field insulating patterns 116 may include an upper pattern 116a and a lower pattern 116. The upper pattern 116a may substantially correspond to respective portions of the field insulating patterns 116 aligned with and/or above the pad oxide patterns 110. The lower pattern 116b may substantially correspond to respective portions of the field insulating patterns 116 occupying the trenches 114 formed in the semiconductor substrate 100.

Figure 5:
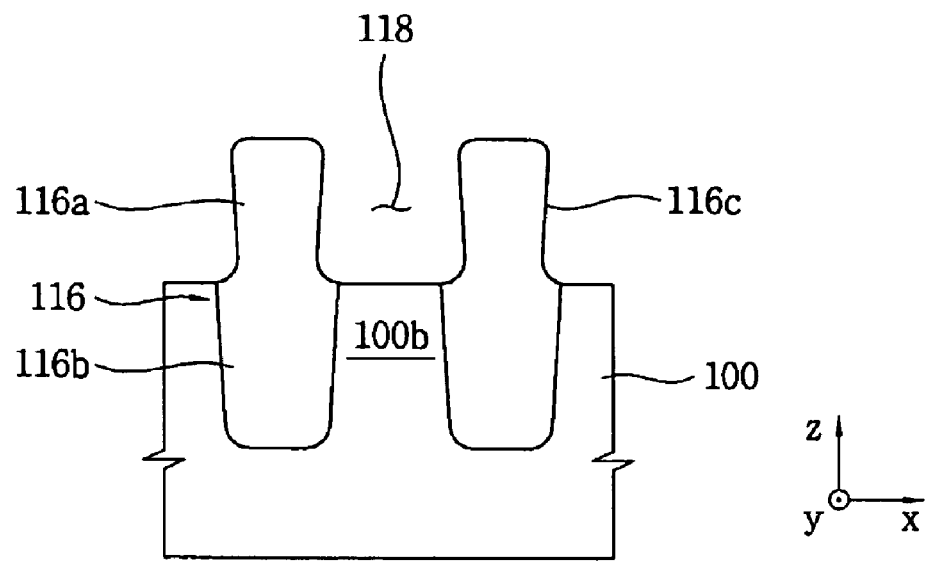

Referring to FIG. 5, the mask patterns 108 and the pad oxide layer patterns 110 may be removed to form second openings 118 exposing the active regions 100b of the semiconductor substrate 100. The mask patterns 108 may be removed by, e.g., an etching solution including phosphoric acid, and the pad oxide layer patterns 110 may be removed by, e.g., a diluted hydrofluoric acid solution. Referring to FIGS. 4 and 5, and more particularly to overall shapes of the upper patterns 116a illustrated therein, when the mask patterns 108 and the pad oxide patterns 110 are removed, a portion of the upper patterns 116a of the preliminary field insulating patterns 116, e.g., portions of the upper patterns 116a around an outer and/or exposed boundary thereof, may also be removed.

Further, the upper patterns 116a of the preliminary field insulating patterns 116 may have side surfaces 116c that are sloped relative to the z direction. Thus, a width, along the x direction, of a portion the upper pattern 116a closer to the semiconductor substrate 100 may be smaller than a width, along the x direction, of a portion of the upper pattern 116a relatively farther from the semiconductor substrate 100. For example, as shown in the exemplary embodiment illustrated in FIG. 6, a width, along the x direction, of the upper pattern (s) 116a may taper, e.g., gradually decrease, along the z direction approaching toward the semiconductor substrate 100. In such embodiments, e.g., as shown in FIG. 5, a lower portion of the second opening(s) 118 may have larger width along the x direction than a width of an upper portion of the second opening(s) 118 along the x direction. More particularly, a width, along the x direction, of the second opening(s) 118 may taper, e.g., gradually decrease, along the z direction approaching toward the semiconductor substrate 100.

Figure 6:
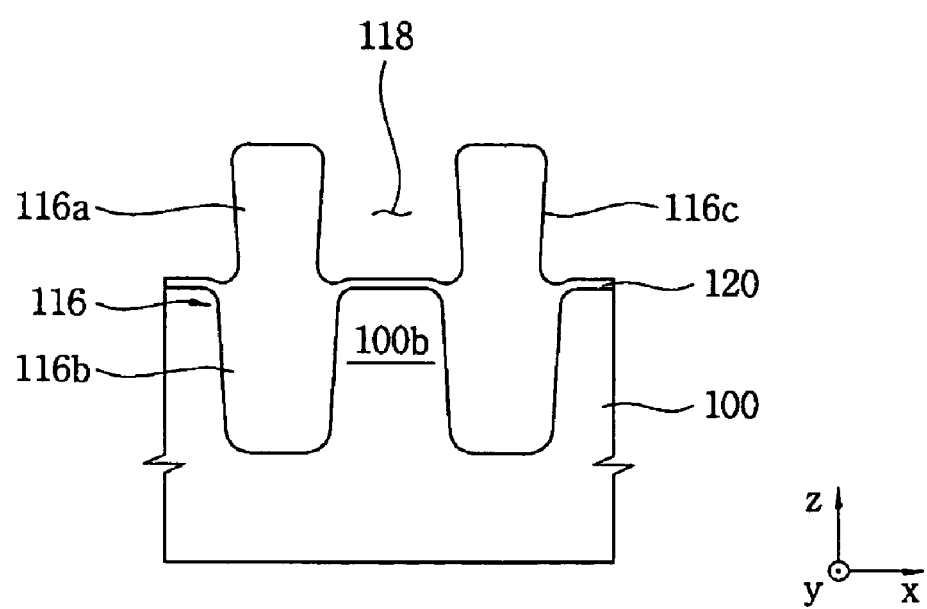

Referring to FIG. 6, a tunnel insulating layer 120 may be formed on the exposed active regions 100b. The tunnel insulating layer 120 may include silicon oxide formed, e.g., by a thermal oxidation process, and may be formed to a thickness of about 30 Å to about 150 Å on the active regions 100b. For example, the tunnel insulating layer 120 may be formed to a thickness of about 75 Å on the active regions 100b by a thermal oxidation process using oxygen ($O_2$) gas, water ($H_2O$) vapor, or a mixture thereof.

In other embodiments of the invention, the tunnel insulating layer 120 may be formed at a temperature of about 800° C. to about 1050° C., e.g., at a temperature of about 900° C., by, e.g., a radical oxidation process using oxygen ($O_2$) gas and hydrogen ($H_2$) gas.

In some embodiments of the invention, first and second heat treatment processes may be additionally performed on the tunnel insulating layer 120. The first heat treatment process may be performed under an atmosphere containing nitrogen to densify the tunnel insulating layer 120, and to reduce and/or prevent impurities from penetrating into the active regions 100b. For example, the first heat treatment process may be performed under an atmosphere containing nitrogen ($N_2$) gas and nitric oxide (NO) gas. Further, defect sites such as silicon dangling bonds, unstable Si—H bonds, etc, in the tunnel insulating layer 120 may be removed by performing the first heat treatment process.

The second heat treatment process may be performed under an atmosphere containing oxygen ($O_2$) gas and hydrogen chloride (HCl) gas to remove some and/or all defect sites remaining after performing the first heat treatment process. The first and second heat treatment processes may be performed at a temperature of about 800° C. to about 1050° C., e.g., at a temperature of about 900° C. The oxidation process for forming the tunnel insulating layer 120 and the first and second heat treatment processes may be performed in-situ.

Figure 7:
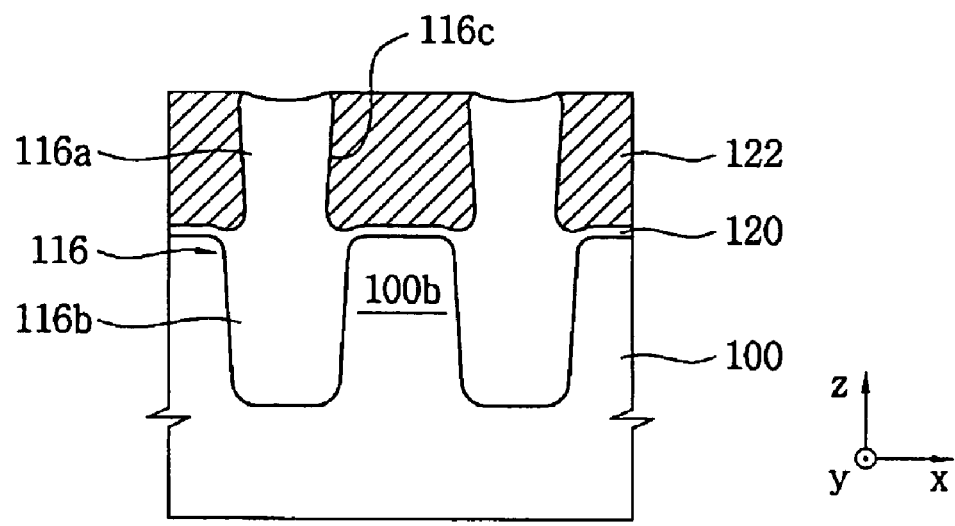

Referring to FIG. 7, a floating gate conductive layer (not shown) may be formed on the tunnel insulating layer 120 and the preliminary field insulating patterns 116 to sufficiently fill up the second openings 118. The floating gate conductive layer may include, e.g., polysilicon doped with impurities, and may be formed at a temperature of, e.g., about 580 to about 620° C. by a chemical vapor deposition process using, e.g., silane ($SiH_4$) gas and phosphine ($PH_3$) gas.

After forming the floating gate conductive layer, a planarization process, e.g., a chemical mechanical polishing process and an etch back process, may be performed to expose the preliminary field insulating patterns 116, thereby forming floating gate electrodes 122 in the second openings 118. A portion of the upper patterns 116a of the preliminary field insulating patterns 116 may be removed during the planarization process.

In other embodiments of the present invention, floating gate patterns may be formed by forming a tunnel insulating layer and a floating gate conductive layer on a semiconductor substrate, and then patterning the floating gate conductive layer. More particularly, in such embodiments of the invention, a tunnel insulating layer and a floating gate conductive layer may be formed on a semiconductor substrate. A mask pattern including oxide or nitride may be formed on the floating gate conductive layer. An anisotropic etching process may be performed to form a floating gate pattern and a tunnel insulating pattern on the semiconductor substrate. Further, trenches for defining an active region may be formed by the anisotropic etching process, and a field insulating layer may be formed to sufficiently fill up the trenches. Preliminary field insulating patterns may be formed by performing a chemical mechanical polishing process until the floating gate pattern is exposed.

Figure 8:
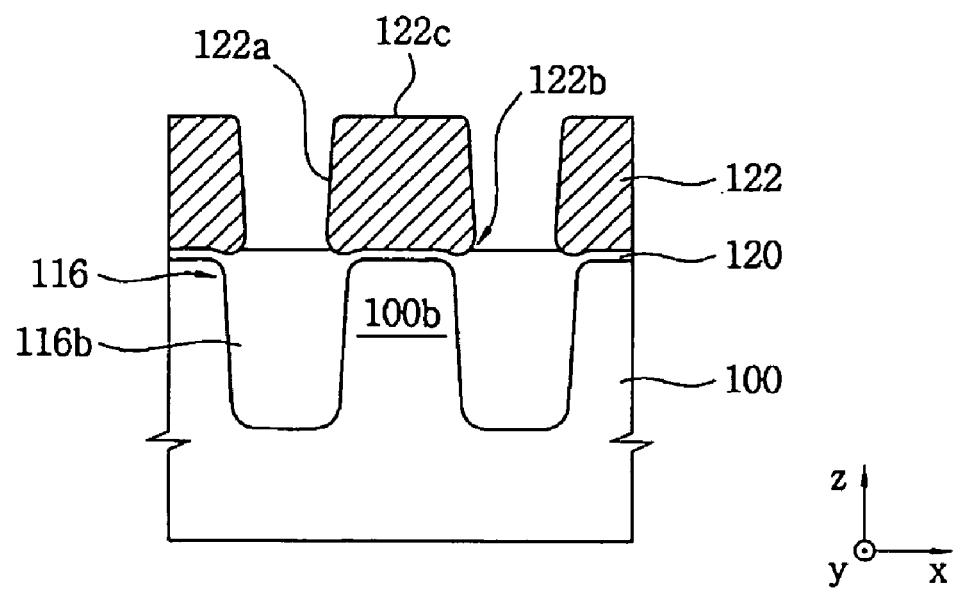

Referring to FIG. 8, the upper patterns 116a of the preliminary field insulating patterns 116 may be removed to expose side surfaces 122a of the floating gate patterns 122. The upper patterns 116a of the preliminary field insulating patterns 116 may be removed by, e.g., an anisotropic or isotropic etching process. The etching process may be performed until lower edge portions 122b of the floating gate patterns 122 are exposed.

In some embodiments of the invention, the upper patterns 116a of the preliminary field insulating patterns 116 may be removed by multiple etching processes, e.g., first and second etching processes. For example, the first etching process may be performed on both cell and periphery regions of the semiconductor substrate 100. The second etching process may be selectively performed on the cell region of the semiconductor substrate 100.

The exposed side surfaces 122a of the floating gate patterns 122 may have an angle of inclination substantially opposite to the slope of the side surfaces 116c of the upper patterns 116a. For example, as shown in FIG. 8, a width, along the x direction, of a portion of the floating gate pattern(s) 122 closer to the semiconductor substrate 100 may be smaller than a width, along the x direction, of a portion of each of the floating gate patterns 122 relatively farther from the semiconductor substrate 100. More particularly, in some embodiments of the invention, a width, along the x direction, of one, some or all of the floating gate patterns 122 may taper, e.g., gradually decrease, along the z direction extending away from the semiconductor substrate 100. In such embodiments, a distance, along the x direction, between adjacent ones of the floating gate patterns 122 may taper, e.g., gradually decrease, along the z direction approaching toward the semiconductor substrate.

Figure 9:
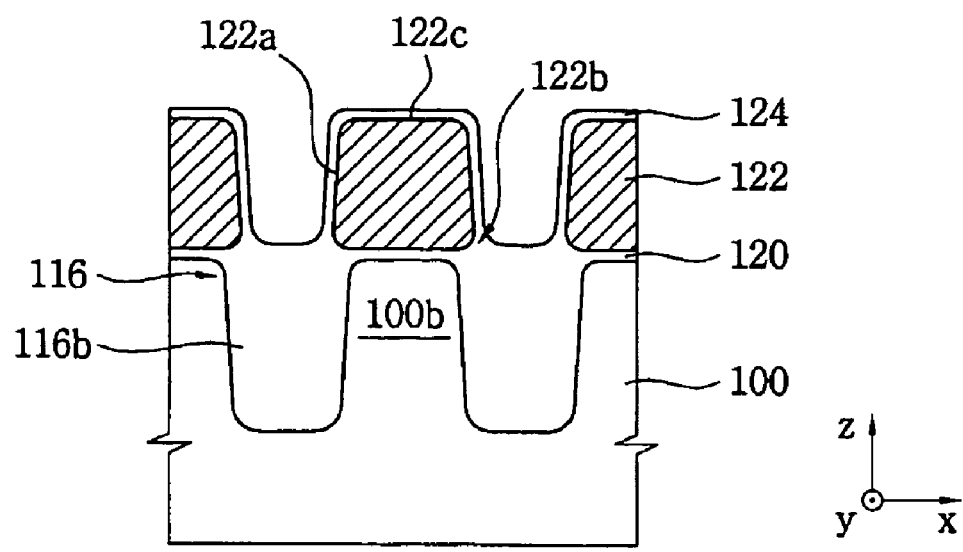

Referring to FIG. 9, a re-oxidation process may be performed to remove defect sites of the floating gate patterns 122 such as silicon dangling bonds and unstable Si—H bonds in the floating gate patterns 122, and more particularly, in portions of the floating gate patterns 122 around an outer boundary thereof. The lower edge portions 122b of the floating gate patterns 122 may be curved, e.g., rounded, by the re-oxidation process.

A silicon oxide layer 124 may be formed on the floating gate patterns 122 by the re-oxidation process. In embodiments of the invention, a radical oxidation process using oxygen ($O_2$) gas and hydrogen ($H_2$) gas may be performed at a temperature of about 800° C. to 1050° C., e.g., about 900° C. In other embodiments of the invention, e.g., a thermal oxidation process using oxygen ($O_2$) gas, water ($H_2O$) vapor or a mixture thereof may be performed.

Figure 10:
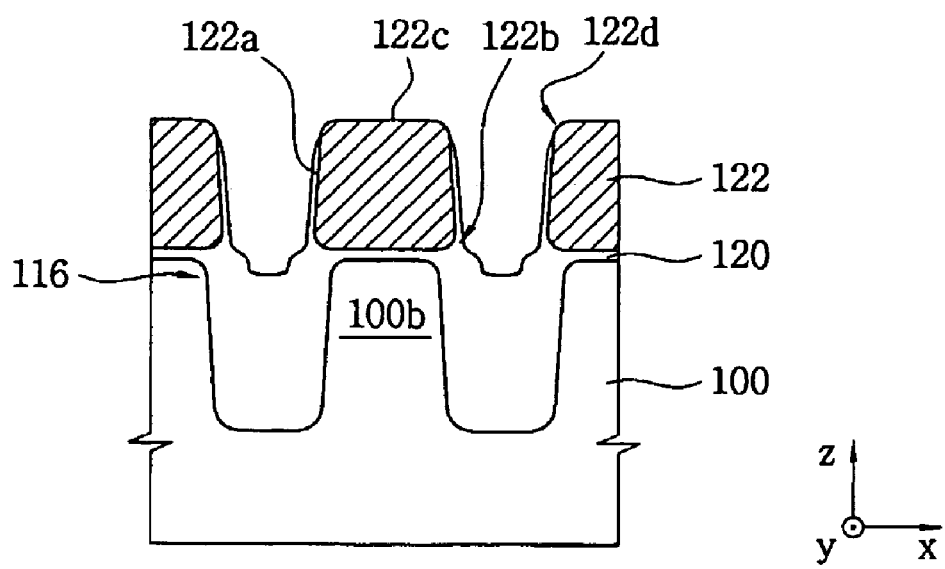

Referring to FIG. 10, an anisotropic etching process may first be performed to remove a portion of the silicon oxide layer 124 on the floating gate patterns 122. More particularly, e.g., the anisotropic etching process may be performed to at least remove the silicon oxide layer 124 on upper surfaces 122c of the floating gate patterns 122 in order to expose the upper surfaces 122c of the floating gate patterns 122. That is, in embodiments of the invention, at least portions of the silicon oxide layer 124 directly overlapping the upper surfaces 122c of the floating gate patterns 122 along the z direction may be removed by the anisotropic etching process. Portions of the silicon oxide layer 124 on the side surfaces 122b of the floating gate patterns 122 may also be partially removed by the anisotropic etching process. More particularly, e.g., portions of the silicon oxide layer 124 on upper portions and/or upper edges 122d of the floating gate patterns may also be removed.

Figure 11:
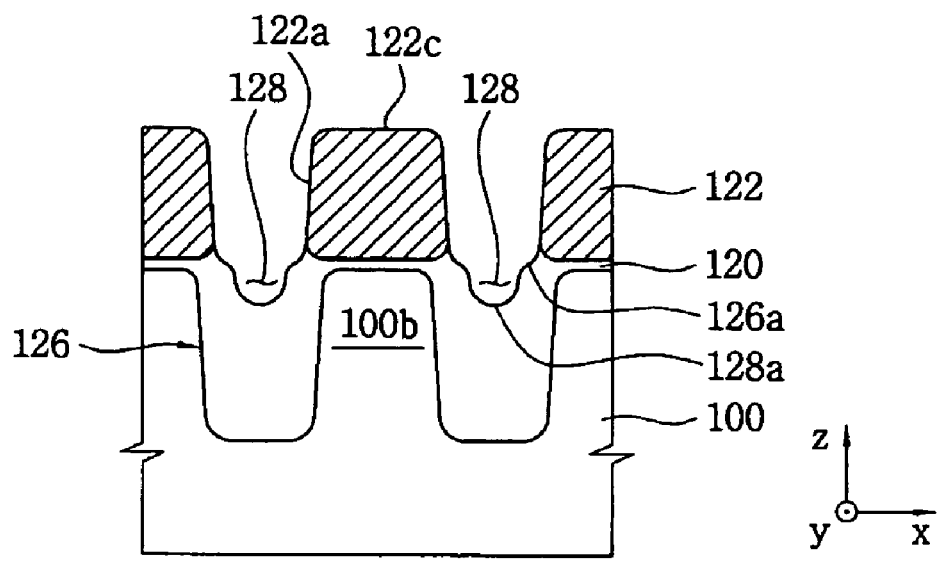

Referring to FIG. 11, an isotropic etching process may then be performed to remove some or all of remaining portions of the silicon oxide layer 124 on the side surfaces 122a of the floating gate patterns 122. For example, as shown in FIG. 11, the remaining portions of the silicon oxide layer 124 on the side surfaces 122a of the floating gate patterns 122 may be substantially or completely removed by the isotropic etching process.

The anisotropic and isotropic etching processes may also result in field insulating patterns 126. The field insulating patterns 126 may electrically isolate the active regions from each other. Upper recesses 128 may be formed along an upper portion, e.g., upper surface 126a, of the field insulating patterns 126. The upper recesses 128 may be formed as a result of the sequentially performed anisotropic and isotropic etching processes. More particularly, as a result of the isotropic etching process, each of the upper recesses 128 may have a curved bottom surface 128a corresponding to a concave portion of the upper surface 126a of one, some or all of the field insulating patterns 126. The concave portion of the upper surface 126a may have, e.g., a substantially semi-circular cross-sectional shape along the x direction.

When the silicon oxide layer 124 is removed only by an isotropic etching process, a distance between the active regions 100b and a subsequently formed control gate electrode may become too narrow. If the distance between the active regions 100b and the subsequently formed respective control gate electrode becomes too narrow, electrical disturbance may occur between the active regions 100b and the respective control gate electrode. Embodiments of the invention enable a sufficient distance between the active regions 100b and the respective subsequently gate electrode to be maintained by, e.g., removing the silicon oxide layer 124 on the floating gate patterns 112 by sequentially performing anisotropic and isotropic etching processes. Thus, embodiments of the invention enable the electrical disturbance between the active regions 100b and the respective subsequently formed control gate electrode to be reduced and/or eliminated.

Figure 12:
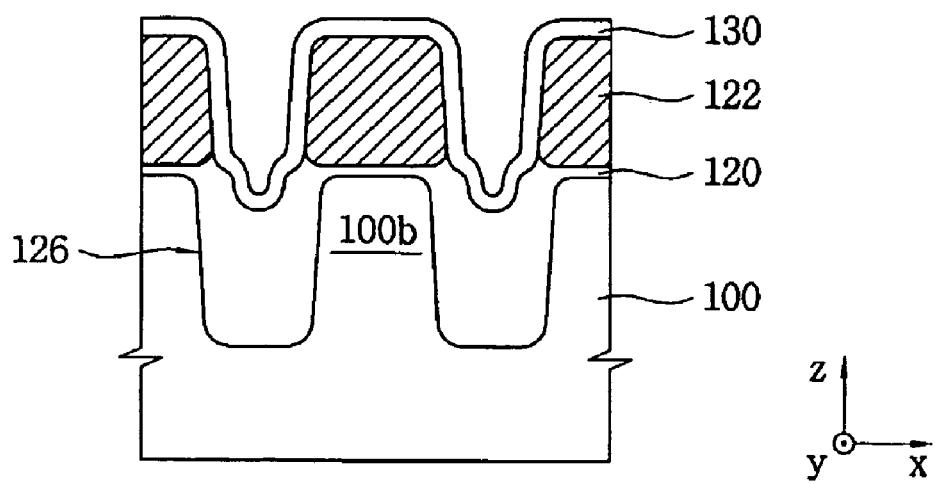

Referring to FIG. 12, a blocking layer 130 may be formed on the floating gate patterns 122 and the field insulating patterns 126. In embodiments of the invention, the blocking layer 130 may be continuously formed along surfaces, e.g., side and upper surfaces 122a, 122c, of the floating gate patterns 122 and along surfaces, e.g., upper surfaces 126a, of the field insulating patterns 126.

Though not shown in the accompanying figures, in some embodiments of the invention, the blocking layer 130 may include multiple layers. For example, in some embodiments of the invention, the blocking layer 130 may include a lower silicon oxide layer, a silicon nitride layer and an upper silicon oxide layer. In such embodiments of the blocking layer 130, the lower silicon oxide layer may be formed to a thickness of, e.g., about 30 Å to about 150 Å on the floating gate patterns 122 and the field insulating patterns 126 by a medium temperature oxide (MTO) deposition or a high-density plasma (HDP) deposition. The silicon nitride layer may be formed to a thickness of, e.g., about 30 Å to about 150 Å on the lower silicon oxide layer by a low pressure chemical vapor deposition. The upper silicon oxide layer may be formed to a thickness of, e.g., about 30 Å to about 150 Å on the silicon nitride layer by, e.g., a medium temperature oxide deposition or a high density plasma deposition.

In some other embodiments of the invention, e.g., the blocking layer 130 may include a lower silicon oxide layer, a metal oxide layer and an upper silicon oxide layer. The metal oxide layer may have a dielectric constant higher than that of silicon nitride, and may be formed to a thickness of, e.g., about 20 Å to about 100 Å by an atomic layer deposition or a chemical vapor deposition. In such embodiments of the invention, the metal of the metal oxide layer may include, e.g., one or more of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and/or lutetium (Lu), etc. More particularly, in embodiments of the invention, the metal of the metal oxide layer may include a single metal, or a combination of different metals. For example, a metal oxide employable for the metal oxide layer may include one or more of hafnium oxide ($HfO_2$), zirconium oxide ($ZrO_2$), aluminum oxide ($Al_2O_3$), hafnium aluminum oxide (HfAlO), lanthanum oxide ($La_2O_3$), hafnium lanthanum oxide (HfLaO), and/or aluminum lanthanum oxide (AlLaO), etc. More particularly, in embodiments of the invention, the metal oxide of the metal oxide may include a single metal oxide, or a combination of different metal oxides.

In yet some other embodiments of the invention, the blocking layer 130 may include a lower dielectric layer, a middle dielectric layer and an upper dielectric layer. The middle dielectric layer may include a material having an energy band gap lower than that of the lower dielectric layer, and the upper dielectric layer may include substantially a same material as the lower dielectric layer. The lower dielectric layer may include, e.g., aluminum oxide. The middle dielectric layer may include, e.g., one or more of hafnium oxide, and/or zirconium oxide, etc. More particularly, in embodiments of the invention, the lower dielectric layer may include a single dielectric material, or a combination of different dielectric materials.

Figure 13:
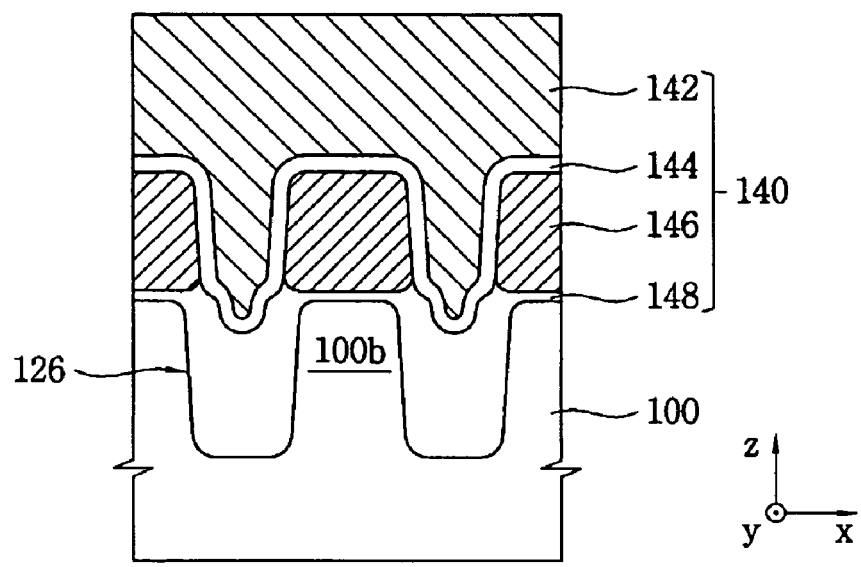
Figure 14:
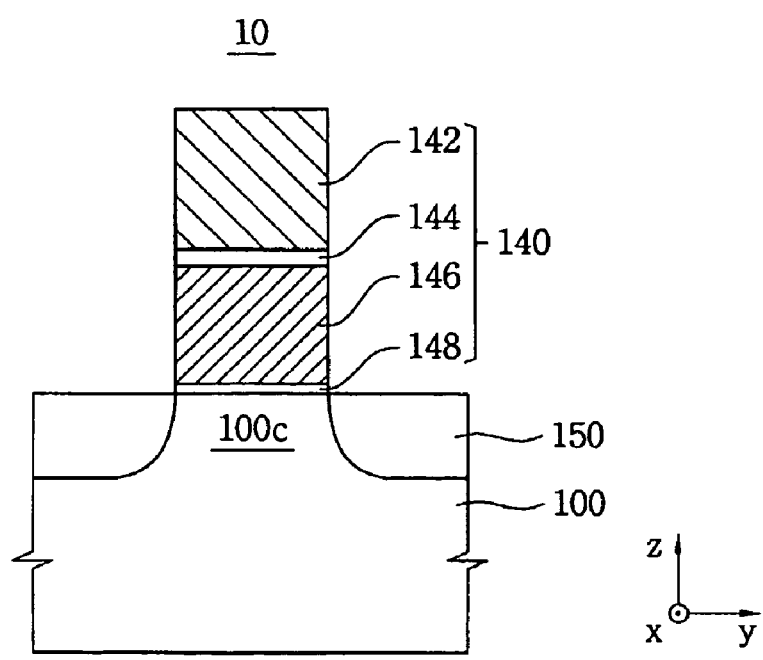

Referring to FIG. 13, a control gate conductive layer (not shown) may be formed on the blocking layer 130. Spaces between the floating gate patterns 122 and the upper recesses 128 may be substantially and/or completely filled up with a conductive material included in the control gate conductive layer.

In some embodiments of the invention, a conductive material employable for the control gate conductive layer may include, e.g., one or more of polysilicon doped with impurities, metal, and/or metal silicide, etc. More particularly, in embodiments of the invention, the conductive material employable for the control gate conductive layer may include a single conductive material, or a combination of different conductive materials. For example, the control gate conductive layer may include a polysilicon layer and a metal layer, or a metal silicide layer formed on the polysilicon layer. A metal employable for the metal layer may include, e.g., tungsten, and a metal silicide employable for the metal silicide layer may include tungsten silicide (WSix), titanium silicide (TiSix), cobalt silicide (CoSix), and/or tantalum silicide (TaSix), etc. More particularly, in embodiments of the invention, the metal layer may include a combination of different metals and/or metal silicides.

In some other embodiments of the invention, the control gate conductive layer may include, e.g., a polysilicon layer doped with impurities, an ohmic layer, a metal barrier layer and a metal layer. A metal silicide layer may be used as the ohmic layer, and a metal nitride layer may be used as the metal barrier layer.

Referring to FIG. 13, the control gate conductive layer, the blocking layer 130, the floating gate patterns 122 and the tunnel insulating layer 120 may be sequentially patterned to form stacked structures such as a gate structures 140. The gate structures 140 may extend substantially perpendicular to the x direction, e.g., along the y direction, on the active regions 100b of the semiconductor substrate 100. The patterning process for forming the gate structures 140 may be performed until the active regions 100b are exposed. Further, the gate structures 140 may be disposed on channel regions of the active regions 100b.

Each of the gate structures 140 may include a control gate electrode 142, a blocking layer pattern 144, a floating gate electrode 146 and a tunnel insulating pattern 148. The control gate electrode 142 may include a polysilicon layer pattern and a metal layer pattern serving as a word line.

The gate structures 140 may be formed by an anisotropic etching process. For example, a photoresist pattern may be formed on the control gate conductive layer, and a reactive ion etching process using the photoresist pattern as an etching mask may be then performed to form the gate structures 140.

In some embodiments of the invention, a mask pattern (not shown) made of oxide or nitride may be formed on the control gate conductive layer, and a reactive ion etching process using the mask pattern may be performed to form the gate structures 140.

Surface portions of the gate structures 140 and the substrate 100 may be damaged during the reactive ion etching process. For example, a number of defect sites may occur at the surface portions of the gate structures 140. Particularly, defect sites such as silicon dangling bonds, strained Si—O bonds, unstable Si—H bonds, etc. may occur at edge portions of the tunnel insulating pattern 148. The defect sites may serve as trap sites in which electrons or holes are trapped during a programming or erasing operation of a semiconductor device such as a non-volatile memory device, and thus data retention performance and operating reliability of the semiconductor device may be deteriorated. In embodiments of the invention, a re-oxidation process may be performed to cure damages of the gate structures 140. An oxide layer may be formed on the gate structures 140 and the substrate 100 by the re-oxidation process.

Referring to FIG. 14, impurity diffusion regions 150 serving as source/drain regions may be formed at surface portions of the active regions 100b adjacent to the gate structures 140 on channel regions 100c to thereby constitute a semiconductor device 10, e.g., a non-volatile memory device, on the semiconductor substrate 100. The impurity diffusion regions 150 may be formed by an ion implantation process and a heat treatment process for electrically activating the impurities. Further, spacers (not shown) may be formed on side surfaces of the gate structures 140 before and/or after forming the impurity diffusion regions 150.

Embodiments of the invention may sequentially perform anisotropic and isotropic etching processes to remove a silicon oxide layer formed by a re-oxidation process for floating gate patterns, and may thereby enable a sufficient or at least a minimum distance between an active region and a control gate electrode to be maintained. Thus, embodiments of the invention may reduce and/or prevent electrical disturbance between the active region and the control gate electrode, and may improve operating reliability of a semiconductor device such as a non-volatile memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device comprising:
   forming a tunnel insulating layer on an active region of a substrate;
   forming field insulating patterns in surface portions of the substrate to define the active region, each of the field insulating patterns having an upper recess formed at an upper surface portion thereof;
   forming a stacked structure on the tunnel insulating layer;
   forming impurity diffusion regions at surface portions of the active region adjacent to the stacked structure;
   forming preliminary field insulating patterns to define an opening exposing the active region; and
   forming a floating gate conductive layer on the tunnel insulating layer and the preliminary field insulating patterns to fill up the opening.

2. The method as claimed in claim 1, wherein the upper recess has a curved bottom surface.

3. The method as claimed in claim 1, wherein, each of the preliminary field insulating patterns includes a lower pattern directly between respective facing ones of the surface portions of the substrate and an upper pattern protruding beyond an upper surface of the active region of the substrate.

4. The method as claimed in claim 3, wherein forming the preliminary field insulating patterns comprises:
   forming mask patterns on the substrate;
   patterning the surface portions of the substrate using the mask patterns to form trenches at the surface portions of the substrate;
   forming a field insulating layer on the mask patterns and the substrate to fill up the trenches;
   planarizing the field insulating layer to form the preliminary field insulating patterns and to expose the mask patterns; and
   removing the mask patterns to form the opening.

5. The method as claimed in claim 4, further comprising:
   planarizing the floating gate conductive layer to form a floating gate pattern in the opening and to expose the preliminary field insulating patterns.

6. The method as claimed in claim 5, wherein forming the field insulating patterns comprises:
- removing the upper patterns of the preliminary field insulating patterns to expose side surfaces of the floating gate pattern;
- performing a re-oxidation process to remove defect sites of the floating gate pattern;
- performing an anisotropic etching process to remove an oxide layer formed on the floating gate pattern by the re-oxidation process; and
- performing an isotropic etching process to remove remaining portions of the oxide layer after the anisotropic etching process.

7. The method as claimed in claim 6, wherein the stacked structure includes a floating gate electrode, a blocking layer pattern and a control gate, and forming the stacked structure comprises:
- forming a blocking layer on the floating gate pattern and the field insulating patterns;
- forming a control gate conductive layer on the blocking layer; and
- patterning the control gate conductive layer, the blocking layer, the floating gate pattern and the tunnel insulating layer, thereby respectively defining the control gate, the blocking layer pattern, the floating gate electrode, and a tunnel insulating pattern.

8. The method as claimed in claim 7, wherein the blocking layer extends continuously along surfaces of the floating gate pattern and the field insulating patterns.

9. The method as claimed in claim 7, wherein the blocking layer comprises a lower dielectric layer, a middle dielectric layer and an upper dielectric layer.

10. The method as claimed in claim 9, wherein the lower and upper dielectric layers comprise silicon oxide, and the middle dielectric layer comprises silicon nitride or a metal oxide having a dielectric constant higher than that of silicon nitride.

11. The method as claimed in claim 10, wherein the metal oxide comprises at least one of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

12. The method as claimed in claim 7, wherein forming the control gate conductive layer comprises filling up the upper recesses of the field insulating patterns.

13. The method as claimed in claim 1, further comprising:
- performing a first heat treatment process under an atmosphere containing nitrogen to remove defect sites of the tunnel insulating layer; and
- performing a second heat treatment process under an atmosphere containing chlorine to remove remaining defect sites after performing the first heat treatment process.

14. The method as claimed in claim 13, wherein the first heat treatment process is performed using a reaction gas including nitrogen ($N_2$) and nitric oxide (NO).

15. The method as claimed in claim 13, wherein the second heat treatment process is performed using a reaction gas including oxygen ($O_2$) and hydrogen chloride (HCl).

16. The method as claimed in claim 13, wherein the first and second heat treatment processes are performed at a temperature of about 800° C. to about 1050° C.

* * * * *